United States Patent
Baumgartner et al.

(10) Patent No.: US 9,373,760 B2
(45) Date of Patent: Jun. 21, 2016

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventors: Alexander Baumgartner, Donaustauf (DE); Markus Richter, Burglengenfeld (DE); Hans-Christoph Gallmeier, Regensburg (DE); Tony Albrecht, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/651,306

(22) PCT Filed: Dec. 11, 2013

(86) PCT No.: PCT/EP2013/076271
§ 371 (c)(1),
(2) Date: Jun. 11, 2015

(87) PCT Pub. No.: WO2014/090894
PCT Pub. Date: Jun. 19, 2014

(65) Prior Publication Data
US 2015/0333235 A1 Nov. 19, 2015

(30) Foreign Application Priority Data
Dec. 14, 2012 (DE) .......................... 10 2012 112 307

(51) Int. Cl.
*H01L 33/44* (2010.01)
*H01L 33/58* (2010.01)
*H01L 33/50* (2010.01)

(52) U.S. Cl.
CPC .............. *H01L 33/507* (2013.01); *H01L 33/58* (2013.01); *H01L 33/505* (2013.01); *H01L 33/508* (2013.01)

(58) Field of Classification Search
CPC ... H01L 33/505; H01L 33/507; H01L 33/486; H01L 33/44; H01L 33/58; H01L 33/508
See application file for complete search history.

(56) References Cited

U.S. PATENT DOCUMENTS 6,635,987 B1 10/2003 Wojnarowski et al.
7,462,502 B2 12/2008 Paolini et al.
(Continued)

FOREIGN PATENT DOCUMENTS

DE 102010009456 A1 9/2011
JP 2006352061 A 12/2006
(Continued)

OTHER PUBLICATIONS

Schnitzer, I., et al., "30% External Quantum Efficiency from Surface Textured, Thin-Film Light-Emitting Diodes," Applied Physics Letters, vol. 63, No. 16, Oct. 18, 1993, pp. 2174-2176.

*Primary Examiner* — Davienne Monbleau
*Assistant Examiner* — Fazli Erdem
(74) *Attorney, Agent, or Firm* — Slater Matsil, LLP

(57) ABSTRACT

The invention relates to an optoelectronic semiconductor element that emits mixed-color radiation when in operation. The optoelectronic semiconductor component comprises an optoelectronic semiconductor chip, a conversion element that has a curvature, and a spacer element that is arranged between the optoelectronic semiconductor chip and conversion element. The spacer has a curved surface that faces the conversion element, with the conversion element being in direct contact with the curved surface.

15 Claims, 1 Drawing Sheet

(56) References Cited

U.S. PATENT DOCUMENTS

| | | |
|---|---|---|
| 7,812,516 B2 | 10/2010 | Maruyama et al. |
| 8,736,160 B2 | 5/2014 | Tamaki et al. |
| 8,785,951 B2 | 7/2014 | Wirth |
| 8,846,423 B2 | 9/2014 | Camras et al. |
| 8,890,140 B2 | 11/2014 | Eberhardt et al. |
| 2007/0228390 A1 | 10/2007 | Hattori et al. |
| 2011/0006331 A1* | 1/2011 | Shaikevitch .......... H01L 33/507 257/98 |
| 2011/0210358 A1 | 9/2011 | Kim et al. |
| 2012/0132944 A1* | 5/2012 | Hsieh ................. H01L 33/46 257/98 |
| 2012/0299019 A1* | 11/2012 | Lin .................... H01L 33/507 257/88 |

FOREIGN PATENT DOCUMENTS

| | | |
|---|---|---|
| JP | 2007324608 A | 12/2007 |
| JP | 2008135537 A | 6/2008 |
| JP | 2010186968 A | 8/2010 |
| WO | 2010022699 A1 | 3/2010 |
| WO | 2011104364 A1 | 9/2011 |

* cited by examiner

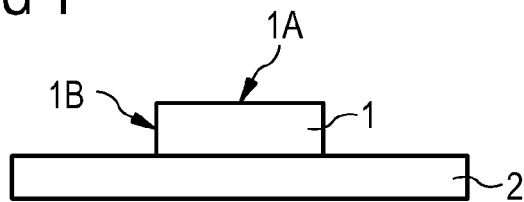
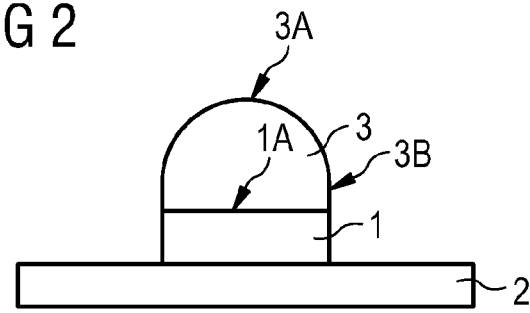
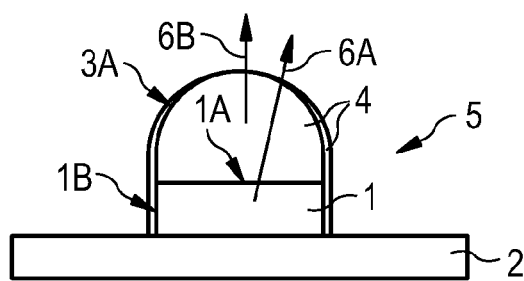
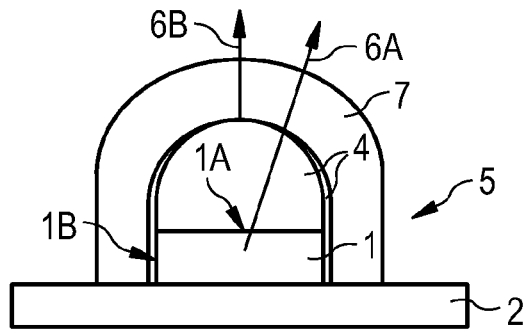

OPTOELECTRONIC SEMICONDUCTOR COMPONENT AND METHOD FOR PRODUCING AN OPTOELECTRONIC SEMICONDUCTOR COMPONENT

This patent application is a national phase filing under section 371 of PCT/EP2013/076271, filed Dec. 11, 2013 which claims the priority of German patent application 10 2012 112 307.1, filed Dec. 14, 2012, each of which is incorporated herein by reference in its entirety.

TECHNICAL FIELD

An optoelectronic semiconductor component which emits mixed-colored radiation during operation is specified. Furthermore, a method for producing an optoelectronic semiconductor component which emits mixed-colored radiation during operation is specified.

BACKGROUND

By way of example, WO Publication No. 2010/022699 A1, also published as U.S. Pat. No. 8,785,951 B2, describes an optoelectronic component which emits mixed-colored radiation. For this purpose the component comprises a radiation-emitting semiconductor chip and a conversion element spanning the semiconductor chip. Such a conversion element, which is arranged in a manner remote from the semiconductor chip and has a three-dimensional structure, is designated as a "remote phosphor" element. Although such a component has a relatively high conversion efficiency on account of the three-dimensional structure, it has significantly larger dimensions than the semiconductor chip.

SUMMARY

Embodiments of the present invention specify a compact optoelectronic semiconductor component which converts primary radiation into secondary radiation in an efficient manner during operation. Further embodiments specify a method for producing such an optoelectronic semiconductor component.

In accordance with at least one embodiment, the optoelectronic semiconductor component comprises an optoelectronic semiconductor chip that generates primary radiation during operation. The primary radiation can be assigned a first (peak) wavelength or a first wavelength range, in particular in the visible range.

Preferably, the optoelectronic semiconductor chip comprises a semiconductor layer sequence having an active zone for generating the primary radiation. The active zone can comprise a pn junction, a double hetero structure, a single quantum well structure (SQW structure) or a multi quantum well structure (MWQ structure).

Besides the active zone, the semiconductor layer sequence can comprise further functional layers and functional regions, for instance p- or n-doped charge carrier transport layers, undoped or p- or n-doped confinement, cladding or waveguide layers, barrier layers, planarization layers, buffer layers, protective layers and combinations thereof. The semiconductor layer sequence can be grown on a growth substrate by an epitaxy method, for example, by metal organic vapor phase epitaxy (MOVPE) or molecular beam epitaxy (MBE). The semiconductor layer sequence can be formed, for example, from a material on the basis of $In_xGa_yAl_{1-x-y}N$, wherein in each case $0 \leq x \leq 1$ and $0 \leq y \leq 1$ hold true. In this case, the semiconductor layer sequence is suitable for emitting short-wave visible, in particular from green to blue, primary radiation.

The optoelectronic semiconductor chip has a radiation exit surface and at least one side surface running transversely with respect to the radiation exit surface. The side surface preferably runs perpendicularly to the radiation exit surface. The "at least one side surface" should be understood, in particular, to mean that the semiconductor chip has one side surface if it has a cylindrical lateral surface. If the semiconductor chip is embodied in a parallelepipedal fashion, it has four side surfaces.

Furthermore, the optoelectronic semiconductor component preferably comprises a conversion element provided with a curvature, said conversion element being provided for wavelength conversion of at least part of the primary radiation into secondary radiation. The secondary radiation can be assigned a second wavelength range or a second (peak) wavelength, which in particular is greater than the first (peak) wavelength. The conversion element is therefore provided for so-called "down conversion", in which the generation of light having a longer wavelength is excited by light having a shorter wavelength.

The conversion element is preferably arranged on the optoelectronic semiconductor chip.

The conversion element comprises, in particular, at least one or a plurality of conversion substances suitable for wavelength conversion. By way of example, the optoelectronic semiconductor chip can emit blue light that is at least partly converted into green and/or red and/or yellow light by the conversion element, such that the semiconductor component can emit white light during operation. The conversion element can be applied, for example, in the form of particles embedded in a matrix material such as, for example, a synthetic, for instance, silicone.

Furthermore, the optoelectronic semiconductor component advantageously comprises a spacer element, which is arranged between the optoelectronic semiconductor chip and the conversion element. A surface of the spacer element facing the conversion element is preferably embodied in a curved fashion. The conversion element is in direct contact with the curved surface. This imparts a corresponding curvature to the conversion element. Preferably, the curved surface of the spacer element is convexly curved. By way of example, the curved surface can be embodied like the surface of a sphere segment. Accordingly, an interface of the conversion element facing the spacer element is embodied like the surface of a sphere segment.

In the case of a conversion element provided with a curvature, a reduced radiance advantageously prevails on account of the non-planar geometry at the conversion location, which is manifested in a higher conversion efficiency of the conversion substances. At the same time, the component in which the conversion element is arranged on the semiconductor chip has a compact size since it has dimensions scarcely larger than the semiconductor chip.

In accordance with at least one embodiment, the optoelectronic semiconductor chip is a surface emitter. The optoelectronic semiconductor chip thus emits a large part of the primary radiation through the radiation exit surface.

Advantageously, the three-dimensional structure of the conversion element provided with a curvature in the case of a surface emitter, too, enables a comparatively homogeneous emission characteristic, that is to say that the color locus of the mixed-colored radiation emitted by the semiconductor component fluctuates to a small extent depending on the emission angle.

Preferably, the optoelectronic semiconductor chip is a thin-film chip which to a good approximation is a Lambertian surface emitter. A thin-film chip is, in particular, free of a growth substrate. A basic principle of a thin-film light-emitting diode chip is described, for example, in I. Schnitzer et al., Appl. Phys. Lett. 63 (16), Oct. 18, 1993, 2174-2176, the disclosure content of which in this respect is hereby incorporated by reference.

In accordance with at least one embodiment, the conversion element is applied as a layer of uniform thickness to the curved surface. Advantageously, the conversion layer of uniform thickness has the effect that the path lengths in the conversion element and thus the conversion proportions depending on the angle are approximately identical. The layer can be formed from a single layer or comprise a plurality of partial layers. A minimum layer thickness of a partial layer can be determined in this case by a particle size of the converter particles and is, in particular, approximately 5 µm.

By way of example, the conversion element can be applied to the curved surface of the spacer element by spray coating. It is also conceivable for the conversion element to be applied by a screen printing method, by spin coating or blade coating. Furthermore, it is possible for the converter particles to be applied to the curved surface by electrophoresis. The converter particles can subsequently be fixed to the curved surface by embedding into a matrix material.

In accordance with at least one embodiment, the curved surface of the spacer element facing the conversion element is completely covered by the conversion element. Therefore, the conversion element has, in particular, no material interruptions in the region of the curved surface.

In accordance with at least one embodiment, the at least one side surface of the semiconductor chip is covered by the conversion element. In one advantageous method for producing the conversion element, targeted application, in which only a delimited region is coated by a mask, for example, is dispensed with, in order to keep the production outlay low. This has the consequence that the conversion element can also pass onto the at least one side surface and, if appropriate, onto a connection carrier on which the semiconductor chip is fixed.

In accordance with at least one embodiment, the spacer element is in direct contact with the radiation exit surface of the semiconductor chip. The spacer element can be applied directly to the radiation exit surface. In particular, the spacer element is arranged only on the radiation exit surface. Preferably, the at least one side surface is not covered by the spacer element.

In accordance with at least one embodiment, the spacer element is transmissive to the primary radiation. In particular, the spacer element is formed from a transparent synthetic material, for example, a silicone.

In accordance with at least one embodiment, the optoelectronic semiconductor component comprises an optical element arranged on the conversion element.

Preferably, the optical element is a lens provided for beam shaping. In particular, the optical element is provided for beam concentration of the mixed-colored radiation composed of the primary radiation and the secondary radiation. Advantageously, the optical element is transmissive to the primary radiation and secondary radiation.

In accordance with at least one embodiment, the optical element is disposed downstream of the semiconductor chip proceeding from the latter at the radiation exit surface and the at least one side surface. In particular, the optical element spans the semiconductor chip, such that the latter is covered by the optical element on the at least one side surface and the radiation exit surface. Advantageously, the optical element serves as an encapsulation for the semiconductor chip provided with spacer element and conversion element. An additional housing can be dispensed with as a result.

In accordance with at least one embodiment, the optoelectronic semiconductor component comprises a connection carrier on which the optoelectronic semiconductor chip is arranged. In particular, the optoelectronic semiconductor chip is fixed to the connection carrier. Furthermore, the semiconductor chip can be electrically connected by the connection carrier. By way of example, the connection carrier has a main body and electrical connection regions arranged in and/or on the main body. By way of example, the main body is formed from ceramic, which enables good heat dissipation of the heat that arises during operation.

In accordance with at least one embodiment of a method for producing an optoelectronic semiconductor component which emits mixed-colored radiation during operation as described above, a first method step involves providing an optoelectronic semiconductor chip having a radiation exit surface and at least one side surface running transversely with respect to the radiation exit surface, said chip emitting primary radiation through the radiation exit surface during operation. A next method step involves arranging a material volume on the radiation exit surface and thereby forming a spacer element. A surface tension of the material volume advantageously contributes to the arising of a curved surface. The curvature of the surface can be determined by the size of the material volume. A further method step involves applying a conversion material to the curved surface of the spacer element and thereby forming a curved conversion element.

In accordance with at least one embodiment of the method, the material volume used for forming the spacer element is applied in liquid form. Preferably, in this case, a chip edge of the semiconductor chip that delimits the radiation exit surface serves as a stop edge for the material volume. That is to say that the chip edge prevents the material volume from spreading across the chip edge, for example, also onto the at least one side surface. Preferably, the material volume is applied to the radiation exit surface of the semiconductor chip by a needle.

In accordance with at least one embodiment of the method, the conversion material is applied to the spacer element by spray coating. Preferably, the conversion material is formed from a spraying medium containing a matrix material and converter particles. In particular, the matrix material already surrounds the converter particles in the spraying medium. The converter particles are, for example, distributed in the matrix material and surrounded by the matrix material on all sides. After application, the matrix material can provide for a good adhesion between the spacer element and the converter particles. By way of example, a resin-based or silicone-containing matrix material can be used.

Furthermore, the spraying medium preferably contains a solvent which dilutes the mixture of converter particles and matrix material and thus facilitates spray coating of the conversion material. By way of example, a heptane can be used as solvent. A heptane is suitable, in particular, when a silicone-containing matrix material is used.

In accordance with at least one embodiment of the method, the spraying medium is sprayed onto the spacer element from a nozzle of a spraying device. The spraying medium can be applied to the semiconductor chip in a plurality of layers. This enables the conversion material to be applied uniformly. By way of example, a first spraying burst can be produced for producing a first layer. A second spraying burst can be produced for producing a second layer. A pause can be interposed between the spraying bursts, wherein the spraying medium can solidify to form a thin layer in the pause.

In accordance with at least one embodiment of the method, an optical element is molded onto the semiconductor chip provided with the conversion element and the spacer element. The optical element can be formed from a molding compound. In particular, the molding compound is applied in a positively locking manner to the semiconductor chip provided with the conversion element and the spacer element. This can be carried out in a molding process, for example, by injection, casting or pressing. The molding compound preferably contains a transparent synthetic material such as silicone.

BRIEF DESCRIPTION OF THE DRAWINGS

Further advantages, advantageous embodiments and developments will become apparent from the exemplary embodiments described below in association with the figures.

In the figures:

FIGS. 1 to 4 show different method steps of a method for producing optoelectronic semiconductor components in accordance with various exemplary embodiments.

DETAILED DESCRIPTION OF ILLUSTRATIVE EMBODIMENTS

FIG. 1 illustrates a first method step for producing an optoelectronic semiconductor component which emits mixed-colored radiation during operation. An optoelectronic semiconductor chip 1 having a radiation exit surface 1A and a plurality of side surfaces 1B running transversely, in particular perpendicularly, with respect to the radiation exit surface 1A is provided in this case. The optoelectronic semiconductor chip 1 comprises a semiconductor layer sequence having an active zone for generating primary radiation (not illustrated). Furthermore, the optoelectronic semiconductor chip 1 is provided with electrical contacts (not illustrated), such that it can be electrically operated.

The semiconductor chip 1 is arranged on a connection carrier 2. In particular, the semiconductor chip 1 is fixed to the connection carrier 2. Preferably, the connection carrier 2 comprises electrical connection regions (not illustrated) that are in contact with the electrical contacts of the semiconductor chip 1. Furthermore, the connection carrier 2 can comprise a main body, in and/or on which the connection regions are arranged (not illustrated). By way of example, the main body can be formed from ceramic.

FIG. 2 illustrates a second method step. In this case, a material volume is arranged on the radiation exit surface 1A of the semiconductor chip 1 and a spacer element 3 is formed. A surface tension of the material volume, which is applied in particular in liquid form, contributes to the arising of a curved surface 3A. The material volume is preferably apportioned in a targeted manner in such a way that the surface 3A has a desired curvature. The material volume can be applied to the radiation exit surface 1A in a manner apportioned in a targeted manner by a needle. In particular, a chip edge of the semiconductor chip 1 stops the material volume from encroaching on the side surfaces 1B. The spacer element 3 thus formed has, in particular, a convexly curved surface 3A. The surface 3A can be formed like the surface of a sphere segment. By contrast, a region of the spacer element 3 which is directly adjacent to the semiconductor chip 1 can have planar surfaces 3B.

FIG. 3 illustrates a third method step, in which a conversion material is applied to the curved surface 3A of the spacer element and a curved conversion element 4 is formed. An interface (not identified) of the conversion element 4 that faces the curved surface 3A has in this case, in particular, the same curvature as the surface 3A.

The conversion material is applied to the curved surface 3A uniformly in the form of one or a plurality of layers. In particular, the conversion material is applied by spray coating, as described above.

In one advantageous method for producing the conversion element 4, targeted application, in which only a delimited region is coated by a mask, for example, is dispensed with in order to keep the production outlay low. This has the consequence that the conversion element 4 also passes onto the side surfaces 1B and the connection carrier 2.

An optoelectronic semiconductor component 5 which emits mixed-colored radiation during operation is produced by the method described in association with FIGS. 1 to 3.

The semiconductor component 5 comprises an optoelectronic semiconductor chip 1 which emits primary radiation 6A through the radiation exit surface 1A during operation. Furthermore, the semiconductor component 5 comprises a conversion element 4 provided with a curvature, said conversion element being arranged on the optoelectronic semiconductor chip 1 and being provided for wavelength conversion of at least one part of the primary radiation 6A into secondary radiation 6B. The optoelectronic semiconductor chip 1 is preferably a surface emitter and thus emits a large part of the primary radiation 6A through the radiation exit surface 1A.

Advantageously, the three-dimensional structure of the conversion element 4 provided with a curvature in the case of a surface emitter, too, enables a comparatively homogeneous emission characteristic, that is to say that the color locus of the mixed-colored radiation emitted by the semiconductor component 5 fluctuates to a small extent depending on the emission angle.

Furthermore, the semiconductor component 5 comprises a spacer element, which is arranged between the optoelectronic semiconductor chip 1 and the conversion element 4 and has a curved surface facing the conversion element 4, wherein the conversion element 4 is in direct contact with the curved surface. Moreover, the semiconductor component 5 comprises a connection carrier 2 on which the semiconductor chip 1 is arranged. Furthermore, the semiconductor chip 1 can be electrically connected by the connection carrier 2.

An optoelectronic semiconductor component 5 as illustrated in FIG. 3 can also be supplemented by a housing (not illustrated).

As is illustrated in FIG. 4, in a fourth method step, an optical element 7 can be molded onto the semiconductor chip 1 provided with the spacer element and the conversion element 4. The optical element 7 can be formed from a molding compound applied in a positively locking manner to the semiconductor chip 1 provided with the conversion element 4 and the spacer element. This can be carried out in a molding process, for example, by injection, casting or pressing.

The optical element 7 is arranged on the connection carrier 2. Furthermore, it is disposed downstream of the semiconductor chip 1 proceeding from the latter at the radiation exit surface 1A and the side surfaces 1B. The optical element 7 forms an encapsulation for the semiconductor chip 1 provided with the spacer element and the conversion element 4, such that no additional housing is required.

The optical element 7 is transmissive to the primary radiation 6A and the secondary radiation 6B. Preferably, the optical element 7 contains a transparent synthetic material such as silicone. The optical element 7 is a lens provided for beam shaping. In particular, the optical element 7 is provided for beam concentration of the mixed-colored radiation which is emitted by the semiconductor component 5 and which is composed of the primary radiation 6A and the secondary radiation 6B.

The invention is not restricted to the exemplary embodiments by the description on the basis of said exemplary embodiments. Moreover, the invention encompasses any novel feature and any combination of features, which in particular includes any combination of features in the patent claims, even if this feature or this combination itself is not explicitly specified in the patent claims or exemplary embodiments.

The invention claimed is:

1. An optoelectronic semiconductor component that emits mixed-colored radiation during operation, the optoelectronic semiconductor component comprising:
   an optoelectronic semiconductor chip having a radiation exit surface and side surfaces running transversely with respect to the radiation exit surface, the chip emitting primary radiation through the radiation exit surface during operation;
   a conversion element provided with a curvature, the conversion element being arranged on the optoelectronic semiconductor chip and being configured for wavelength conversion of at least part of the primary radiation into secondary radiation, wherein the side surfaces are covered by the conversion element; and
   a spacer element arranged between the optoelectronic semiconductor chip and the conversion element, the spacer element having a curved surface facing the conversion element, wherein the conversion element is a layer of uniform thickness applied in direct contact with the curved surface, wherein the spacer element is solely arranged on the radiation exit surface and does not cover the side surfaces.

2. The optoelectronic semiconductor component according claim 1, wherein the curved surface of the spacer element facing the conversion element is completely covered by the conversion element.

3. The optoelectronic semiconductor component according to claim 1, wherein the curved surface of the spacer element facing the conversion element is convexly curved.

4. The optoelectronic semiconductor component according to claim 1, wherein the spacer element is in direct contact with the radiation exit surface.

5. The optoelectronic semiconductor component according to claim 1, wherein the spacer element is transmissive to the primary radiation.

6. The optoelectronic semiconductor component according to claim 1, wherein the spacer element is formed from a transparent synthetic material.

7. The optoelectronic semiconductor component according to claim 1, further comprising an optical element arranged on the conversion element.

8. The optoelectronic semiconductor component according to claim 7, wherein the optical element is disposed downstream of the semiconductor chip at the radiation exit surface and the side surfaces.

9. The optoelectronic semiconductor component according to claim 7, wherein the optical element comprises a lens provided for beam shaping.

10. The optoelectronic semiconductor component according to claim 1, wherein the optoelectronic semiconductor chip is a surface emitting thin-film semiconductor chip.

11. A method for producing an optoelectronic semiconductor component that emits mixed-colored radiation during operation, the method comprising:
    providing an optoelectronic semiconductor chip having a radiation exit surface and side surfaces running transversely with respect to the radiation exit surface, the semiconductor chip emitting primary radiation through the radiation exit surface during operation;
    arranging a material volume on the radiation exit surface to form a spacer element, wherein a surface tension of the material volume contributes to formation of a curved surface and wherein the spacer element is solely arranged on the radiation exit surface and does not cover the side surfaces; and
    applying a conversion material to the curved surface of the spacer element to form a curved conversion element, wherein the conversion element is a layer of uniform thickness applied to the curved surface by spray coating, and wherein the side surfaces are covered by the conversion element.

12. The method according to claim 11, wherein the conversion material is applied to the curved surface by spray coating.

13. The method according to claim 11, further comprising molding an optical element onto the semiconductor chip provided with the conversion element and the spacer element.

14. The method according to claim 13, wherein the conversion material is applied to the curved surface by spray coating.

15. The method according to claim 14, wherein the conversion element comprises a layer of uniform thickness.

* * * * *